United States Patent
Bidal et al.

(10) Patent No.: US 8,394,704 B2
(45) Date of Patent: Mar. 12, 2013

(54) METHOD FOR FABRICATING A DUAL-ORIENTATION GROUP-IV SEMICONDUCTOR SUBSTRATE

(75) Inventors: Gregory F. Bidal, Grenoble (FR); Fabrice A. Payet, Sainte Suzanne (FR); Nicolas Loubet, Guilderland, NY (US)

(73) Assignee: NXP B.V., Eindhoven (NL)

( * ) Notice: Subject to any disclaimer, the term of this patent is extended or adjusted under 35 U.S.C. 154(b) by 70 days.

(21) Appl. No.: 12/864,649

(22) PCT Filed: Jan. 20, 2009

(86) PCT No.: PCT/IB2009/050199
§ 371 (c)(1),
(2), (4) Date: Feb. 14, 2011

(87) PCT Pub. No.: WO2009/095813
PCT Pub. Date: Aug. 6, 2009

(65) Prior Publication Data
US 2011/0129983 A1    Jun. 2, 2011

(30) Foreign Application Priority Data
Jan. 28, 2008 (EP) .................. 08290071

(51) Int. Cl.
*H01L 21/76* (2006.01)
*H01L 21/20* (2006.01)

(52) U.S. Cl. ........ 438/413; 438/429; 438/442; 438/481; 257/E21.09; 257/E21.461

(58) Field of Classification Search .................. 438/341, 438/360, 363, 413, 429, 442, 481; 257/E21.09, 257/E21.461
See application file for complete search history.

(56) References Cited

U.S. PATENT DOCUMENTS

| 4,758,531 | A  | * | 7/1988 | Beyer et al. | 438/429 |
|---|---|---|---|---|---|
| 7,060,585 | B1 |   | 6/2006 | Cohen et al. | |
| 2005/0116290 | A1 | * | 6/2005 | de Souza et al. | 257/347 |
| 2006/0272574 | A1 |   | 12/2006 | Waite et al. | |
| 2006/0276011 | A1 | * | 12/2006 | Fogel et al. | 438/486 |
| 2007/0034950 | A1 |   | 2/2007 | Park et al. | |
| 2007/0063306 | A1 |   | 3/2007 | Doyle et al. | |

(Continued)

FOREIGN PATENT DOCUMENTS
WO    2006/130360 A2    12/2006

OTHER PUBLICATIONS

Monfray, S., et al; "First 80nm SON (Silicon-On-Nothing) MOSFETs with perfect morphology and high electrical performance"; IEDM 01; 4 pages (2001).

(Continued)

*Primary Examiner* — Kevin Parendo

(57) ABSTRACT

The present invention relates to method for fabricating a dual-orientation group-IV semiconductor substrate and comprises in addition to performing a masked amorphization on a DSB-like substrate only in first lateral regions of the surface layer, and a solid-phase epitaxial regrowth of the surface layer in only the first lateral regions so as to establish their (100)-orientation. Subsequently, a cover layer on the surface layer is fabricated, followed by fabricating isolation regions, which laterally separate (110)-oriented first lateral regions and (100)-oriented second lateral regions from each other. Then the cover layer is removed in a selective manner with respect to the isolation regions so as to uncover the surface layer in the first and second lateral regions and a refilling of the first and second lateral regions between the isolation regions is performed using epitaxy.

15 Claims, 4 Drawing Sheets

U.S. PATENT DOCUMENTS

| | | | |
|---|---|---|---|
| 2007/0090467 A1 | 4/2007 | Zhu | |
| 2007/0238233 A1* | 10/2007 | Sadaka et al. | 438/187 |
| 2007/0241323 A1 | 10/2007 | Saenger et al. | |
| 2007/0269963 A1* | 11/2007 | Cheng et al. | 438/479 |
| 2008/0220595 A1* | 9/2008 | Lin et al. | 438/511 |
| 2008/0248626 A1* | 10/2008 | Liu et al. | 438/424 |
| 2009/0130817 A1* | 5/2009 | Pinto et al. | 438/424 |

OTHER PUBLICATIONS

Saenger, K.L., et al; "Amorphization/templated recrystalization method for changing the orientation of a single-crystal silicon: An alternative approach to hybrid orientation substrates"; Applied Physics Letters; vol. 87, No. 22; AIP; American Institute of Physics; Melville NY; 3 pages; (Nov. 23, 2005).

Sung, C.Y., et al; "High Performance CMOS Bulk Technology Using Direct Silicon Bond (DSB) Mixed Crystal Orientation Substrates";IEEE International Electron Devices Meeting (IEDM) 4 pages; (2005).

Yang, M., et al; Hybrid-Orientation Technology (HOT): Opportunities and Challenges) IEEE Transaction on Electron Devices, vol. 53, No. 5; pp. 965-978; (May 2006).

Huang, Yao-Tsung, et al; "Amorphization and Templated Recrystallization (ATR) Study for Hybrid Orientation Technology (HOT) using Direct Silicon Bond (DSB) Substrates"; IEEE Xplore; 2 pages (2007).

Yin, Haizhou, et al; "Scalability of Direct Silicon Bonded (DSB) Technology for 32nm Node and Beyond"; 2007 Symposium on VLSI Technology Digest of Technical Papers; 2 pages (2007).

International Search Report and Written Opinion for Application PCT/IB2009/050199 (Jan. 20, 2009).

\* cited by examiner

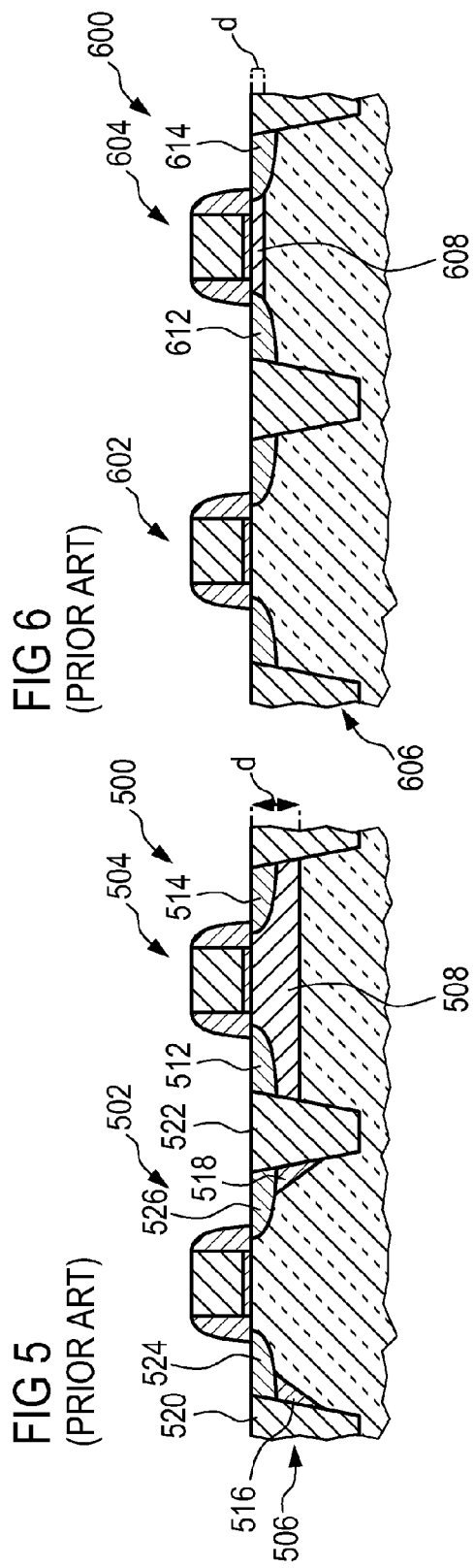

US 8,394,704 B2

METHOD FOR FABRICATING A DUAL-ORIENTATION GROUP-IV SEMICONDUCTOR SUBSTRATE

FIELD OF THE INVENTION

The present invention relates to a method for fabricating a dual-orientation group-IV semiconductor substrate.

BACKGROUND OF THE INVENTION

Conventional (100)-oriented silicon or silicon-on-insulator (SOI) substrates are commonly used in the field of microelectronics. In comparison with other known surface orientations of silicon substrates, the (100)-orientation provides the highest mobility for electrons. However, the (100)-orientation is not advantageous for the hole mobility. In fact, within the group of surface orientations of commercially available for silicon wafers it provides the poorest mobility. This is detrimental for the performance of pMOS (metal-oxide-p-semiconductor) devices on (100)-silicon.

It has been established that silicon substrates with a (110)-orientation provide the best mobility for holes. However, this orientation is detrimental for the electron mobility, i.e. for nMOS (metal-oxide-n-semiconductor) devices, cf. M. Yang et al., IEEE TED, Vol. 53, No. 5, May 2006, pp. 965-978.

As is well known, CMOS (complementary metal-oxide-semiconductor) devices incorporate both types, nMOS and pMOS devices, on a single substrate (chip). To achieve optimum mobility for majority charge carriers in both device types on a single chip, proposals have been made to provide dual-orientation substrates with first lateral surface regions having a (100)-orientation for nMOS devices, and with second lateral surface regions having a (110)-orientation for pMOS devices.

US 2006/0276011 A1 describes methods for fabricating such dual-orientation substrates, which are also called hybrid orientation substrates. Methods known from this document are based on direct-silicon-bonded (DSB) substrates, which have a (110)-oriented silicon surface layer bonded to a (100)-oriented silicon wafer. The fabrication of well-defined lateral regions with different crystal orientations is in some known methods performed by fabricating shallow trench isolations (STI) in a masked etching and filling process, followed by chemical mechanical polishing. Subsequently, a resist layer is deposited and patterned to protect those lateral regions from a subsequent amorphization step, which are to retain their (110)-orientation in the finished substrate. The amorphization is then performed by implanting suitable ions such as silicon or germanium. Subsequently, a so lid-phase-epitaxial regrowth is performed, using the (100)-oriented substrate as the template for recrystallization of the amorphized lateral surface layer regions. With removal of the resist layer, the fabrication of a dual-orientation substrate is completed.

However, as is described in US 2006/0276011 A1, defects are created in this process, which are detrimental for device performance. Specifically, crystallographic defects are generated at the STI edge during the solid-phase epitaxy step. STI-edge defects are a major source of junction leakages in a transistors with a wide active area since those defects are placed in junction depletion region. In case of a narrow active area, i.e., reduced STI-to-STI spacing, STI-edge defects are also a mobility degradation factor since the defects are placed in the transistor channel below the gate. Since those defects are a major source of junction leakages, some solutions have been proposed in US 2006/0276011 to reduce the defect density. In particular, a high-temperature annealing step for defect reduction and an integration scheme that uses the solid-phase epitaxy before the STI formation are proposed. The latter concept is explained in the following with reference to FIGS. 1 to 4.

FIGS. 1 to 4 show schematic cross-sectional views of a dual-orientation silicon substrate during different stages of its fabrication.

Initially, a DSB silicon substrate 100 is provided. The DSB substrate has a (100)-oriented silicon substrate 102 and a (110)-oriented silicon surface layer 104 on top of the substrate 102. Note that, in the context of the present invention, numbers in round brackets indicate crystal orientations while numbers which are not bracketed are used as reference labels.

In a subsequent processing step, the result of which is shown in FIG. 2, a resist layer 106 is deposited on the surface layer 104 and lithographically patterned to provide openings in first lateral regions of the resist layer 106, which correspond to first lateral regions 108 of the surface layer, in which a (100)-oriented surface is desired. Then, an amorphizing ion implant 110 indicated by arrows pointing towards the substrate 100 is performed. Due to the resist pattern 106 provided in previous processing, the amorphization is performed only in the first lateral region 108, the ion implant 110 thus leads to an amorphized silicon layer 112. The amorphized silicon layer 112 extends slightly deeper into the substrate than the surface layer 104. Therefore, the amorphized layer 112 is arranged on top of a (100)-oriented substrate region of the substrate 102. The amorphized layer 112 is then recrystallized by a recrystallization anneal in order to establish a (100)-orientation of the substrate 100 in the first lateral region 108. As shown in FIG. 3, the resist layer 106 has also been removed at this processing stage, revealing second lateral regions 114 of the surface layer 106 with (110)-orientation.

As is shown in FIG. 3, a lateral defect region 116 is generated in the course of the amorphization and recrystallization process. The lateral extension 1 of the lateral defect region 116 roughly corresponds to the thickness d of the originally deposited surface layer 104.

In subsequent processing, STI regions 118 are fabricated in the lateral defect regions 116. In further processing steps, end-of-range defects (not shown) at the former interface between amorphized layer 112 and the substrate 102 are removed by a high-temperature defect-removal anneal.

The processing of US 2006/0276011 A1 has the disadvantage of not being applicable in future CMOS technology nodes with advanced scaling. Moreover, it is not fully compatible with the integration of thin-film devices. Also, the processing scheme is vulnerable to short-channel effects.

FIGS. 5 and 6 show schematic cross-sectional views of different CMOS semiconductor devices 500 and 600. The figures are used to illustrate main causes of junction leakages in semiconductor devices integrated on DSB substrates. In both devices, an nMOSFET 502 and 602, respectively, and a pMOSFET 504 and 604, respectively, are shown. The devices are provided on a dual-orientation substrate 506 and 606, respectively. The two devices 500 and 600 differ in the depth extension d of the (110)-oriented surface layer 508 and 608, respectively. The (110)-oriented surface layer 508 has a depth extension d that reaches deeper than source and drain regions 512 and 514 of the pMOS transistor 504. In the case of the semiconductor device 600, the (110)-oriented surface layer 608 has a smaller depth extension than the source and drain regions 612 and 614 of the pMOS transistor 604. The larger depth extension of the surface layer 508 avoids junction leakages in the pMOS transistor 504 of the semiconductor device 500. However, defect regions 516 and 518 are present in the nMOS transistor 502. The defect regions 516 and 518 extend along sidewalls of STI regions 520 and 522, which define the (100)-oriented, recrystallized first lateral surface region of the dual-orientation substrate 506. These defect regions 516 and 518 form a source of leakages as they extend into source and drain regions 524 and 526 of the nMOS transistor 502.

Therefore, defect problems are present in CMOS semiconductor devices on dual-orientation substrates, with different leakage problems being present in semiconductor devices with surface layers of different thickness.

Thus, one of the main challenges is to provide a dual-orientation substrate which avoids leakage problems in semiconductor devices such as transistors and which can be fabricated also at advanced scaling of the width of the isolation regions and the spacing between isolation regions on opposite lateral sides of an active area.

SUMMARY OF THE INVENTION

According to the present invention, a method for fabricating a dual-orientation group-IV semiconductor substrate is provided. The method comprises the steps:
providing a substrate with a (100)-oriented group-IV semiconductor substrate and a (110)-oriented group-IV semiconductor surface layer on the substrate;
performing a masked amorphization only in first lateral regions of the surface layer, in which first lateral regions a (100)-oriented surface is desired;
performing a solid-phase epitaxial regrowth of the surface layer in only the first lateral regions so as to establish their (100)-orientation;
fabricating a cover layer on the surface layer;
fabricating isolation regions, which extend from the surface of the cover layer towards the inner substrate at least to the surface layer and which laterally separate (110)-oriented first lateral regions and (100)-oriented second lateral regions from each other;
removing the cover layer in a selective manner with respect to the isolation regions so as to uncover the surface layer in the first and second lateral regions,
refilling the first and second lateral regions between the isolation regions by performing an epitaxy of group-IV semiconductor material.

The method of the present invention provides an innovative way to integrate dual-orientation devices while limiting junction leakages. The method of the present invention has the further advantage that it can be used in embodiments to realize thin-film devices with dual orientation.

The method is suitable for silicon or silicon-germanium semiconductor substrates with or without carbon doping. Of course, other dopants for achieving a desired conductivity type can be present.

The method is based on providing a substrate with a (100)-oriented group-IV semiconductor substrate and a (110)-oriented group-IV semiconductor surface layer on the substrate. The group-IV semiconductor substrate is typically a wafer, such a silicon wafer, used in the industry to fabricate semiconductor devices. The surface layer can be fabricated by any known method including known methods of direct silicon bonding.

The method of the present invention includes the use of a cover layer on a pre-processed substrate with dual orientation. In contrast to the method known from US 2006/0276011 A1, the isolation regions are fabricated starting with a substrate that has the cover layer on top. After fabricating the isolation regions, the remaining cover layer sections are removed. Subsequently, an epitaxy, i.e., an epitaxial deposition of group-IV semiconductor material is performed using the dual-orientation lateral regions fabricated earlier underneath the cover layer as templates for the epitaxial growth.

The method is suitable for silicon and related substrates. Alternative materials such as silicon-germanium semiconductor substrates with or without carbon doping can also be used. Of course, dopants for achieving a desired conductivity type may be present.

Note that the term "lateral region" is used here to identify a localized substrate region that has a well-defined extension in lateral directions. Lateral directions are directions, which are parallel to a reference surface. Note also that even though a lateral region has an extension in lateral directions, it need not necessarily be oriented parallel to the reference surface. Regarding the term "reference surface", consider as an exemplary and typical embodiment a wafer for use in the semiconductor industry. Here, the reference surface is the main wafer surface, which is used for the fabrication of functional layers of semiconductor devices such as transistors. Of course, a lateral region typically also has a defined extension in a depth direction, which points from the reference surface towards the inner substrate in a direction perpendicular to the reference surface. However, the use of the term "lateral region" as such shall not imply any restriction regarding the depth extension of the lateral region.

In the following, embodiments of the method of the invention will be described. The additional features of the various embodiments can be combined with each other to form further embodiments of the method of the invention unless different embodiments are described as forming alternatives to each other.

In one embodiment, the (110)-oriented surface layer has a thickness between 30 and 120 nm. Generally, the lateral extension of a defect zone created during the so lid-phase epitaxial regrowth of the surface layer in the first lateral regions is limited by the thickness of the surface layer. Using a thickness of 50 nm in another embodiment will, therefore, generate a defect area with a lateral extension of 50 nm in the worst case, which implies full compatibility with the parameter "$N_{active}/P_{active}$ spacing", indicative of the lateral spacing between the active regions for n- and p-devices, at advanced scaling levels reaching down to the 22 nm CMOS technological node.

The fabrication of the cover layer on the surface layer is preferably performed by depositing a silicon nitride layer. The cover layer is typically deposited on the whole wafer. Using silicon nitride $Si_3N_4$ has the advantage that well-known removal techniques can be used to free the active areas from the cover layer before the epitaxy. For instance, $H_3PO_4$ wet chemistry can be used for selective removal of $Si_3N_4$ without attacking conventional STI-like isolation regions made of $SiO_2$. However, plasma dry etching techniques can also be used for a selective and isotropical etch.

Regarding the fabrication of isolation regions, different embodiments can be used. Beside the conventional STI concept that implies fabricating trenches in the cover layer and filling the trenches with an isolating material, such as $SiO_2$, an alternative concept can be used as follows: The fabrication of the cover layer is performed by depositing a suitable isolating material that is in later steps also used for the isolation regions. Again, a suitable material is $Si_3N_4$. The fabrication of the isolation regions then comprises removing the cover layer in the first and second lateral regions while protecting the cover layer from removal in the desired isolation regions. This can, for instance, be achieved by suitably masking the cover layer and selectively etching the cover layer only in unmasked lateral regions, which correspond to the first and second lateral regions of the surface layer.

In the STI processing alternative, the shallow trenches are preferably fabricated with an extension toward the inner substrate, which reaches beyond an interface between the (100)-oriented substrate and the (110)-oriented surface layer. The refilling of the first and second lateral regions is performed to obtain a flat active area on the substrate surface. There are different processing alternatives to achieve this. One is a selective faceting epitaxy. With this technique, a "rounded" active area is obtained at the end. In this case, an additional planarization step by chemical mechanical polishing (CMP) for instance is therefore needed to re-obtain a flat surface of the active area.

In a preferred alternative processing embodiment, refilling the first and second lateral regions between the isolation regions comprises performing a selective facet-free epitaxy of the group-IV semiconductor material. If the epitaxial growth is performed in a facet free manner, a flat active surface is naturally obtained. Facet-free epitaxy is a technique that is well-known in the art. Selective facet-free epitaxy refers to selective facet-free epitaxial growth only on the group-IV semiconductor material template regions, and not on isolation material, including the isolation region.

Removing the cover layer in a selective manner with respect to the isolation regions and refilling the first and second lateral regions between the isolation regions is in one embodiment performed in the first and second lateral regions at the same time.

However, if desired, these steps can be performed separately for the first and second lateral regions. For instance, these steps are performed at first in the first lateral regions only, and subsequently in the second lateral regions, or vice versa. Suitably, complementary respective masks are used to protect the respective lateral region, which is not being processed.

As mentioned earlier, the method of the present invention is suitable for the fabrication of thin-film devices. To this end, refilling the first and second lateral regions after removal of the cover layer comprises depositing a hetero-stack with a sequence of layers of group-IV-semiconductor material with different material compositions. For instance, a Si/SiGe hetero-stack can be fabricated this way, having a (100)-orientation in the first lateral regions and a (110)-orientation in the second lateral regions.

Embodiments of the method of the invention are also described in the claims.

In the following, further embodiments will be described with reference to the figures.

BRIEF DESCRIPTION OF THE DRAWINGS

The foregoing and other aspects of the invention will be apparent from and elucidated with reference to the embodiment(s) described hereinafter. In the following drawings:

FIGS. 5 and 6 show schematic cross-sectional views of thin prior-art semiconductor devices for illustrating sources of junction leakage in devices with different thicknesses of the surface layer of the dual-orientation substrate;

DETAILED DESCRIPTION OF EMBODIMENTS

FIGS. 7 to 12 show schematic cross-sectional views of a dual-orientation substrate during different fabrication stages according to an embodiment of the method of the invention. The dual-orientation substrate 700 is fabricated starting from a DSB substrate 702 with a (100)-oriented substrate 704 and a (110)-oriented silicon surface layer 706 of approximately 50 nm thickness. As was explained before, the thickness of 50 nm is particularly suitable for advanced CMOS technology nodes. However, different thicknesses may equally be used for other technology nodes.

Figure 1:
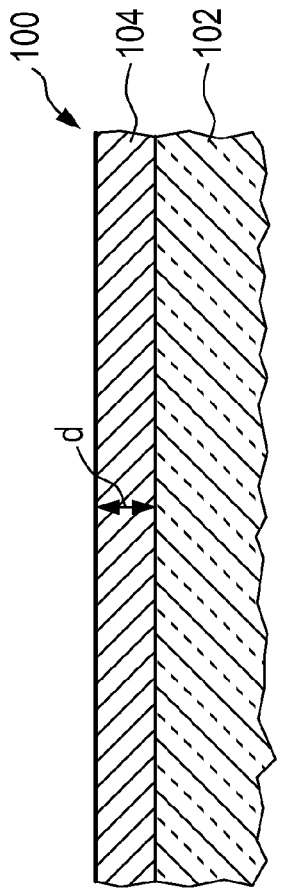
FIGS. 1 to 4 show schematic cross-sectional views of a dual-orientation substrate during different stages of its fabrication according to a prior-art method.
Figure 2:
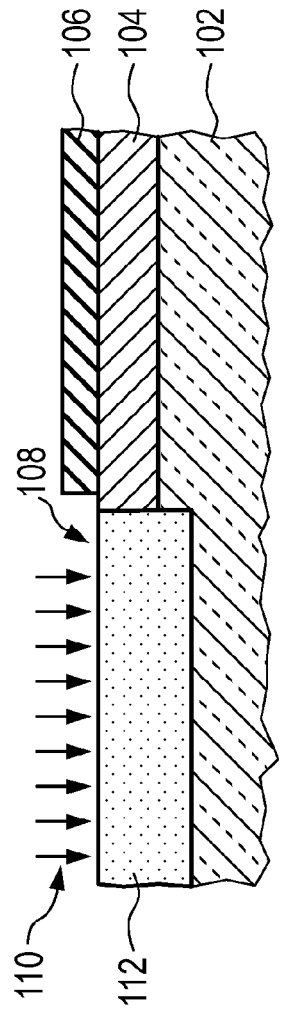
Figure 3:
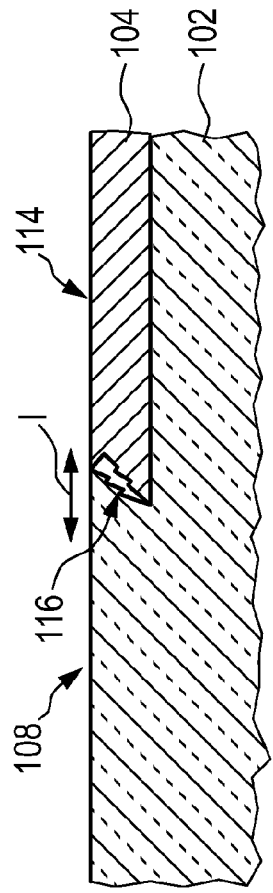
Figure 4:
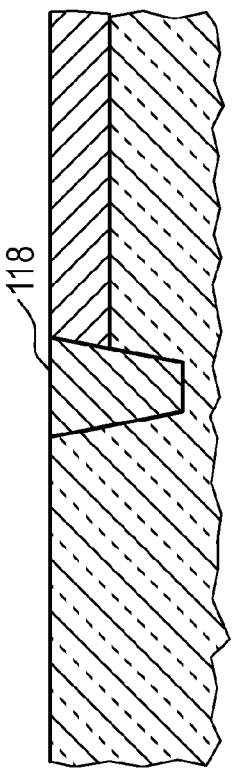
Figure 7:
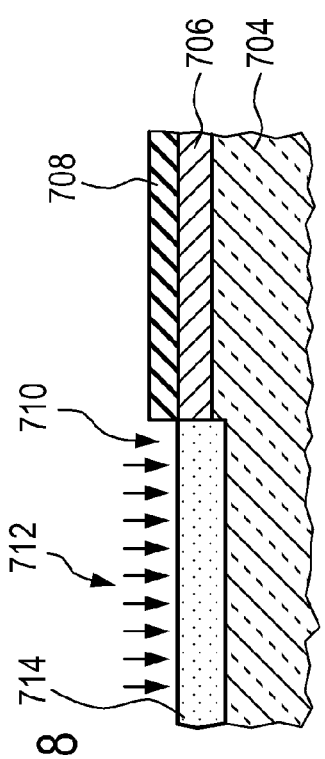
FIGS. 7 to 12 show schematic cross-sectional views of a dual-orientation substrate during different fabrication stages according to an embodiment of the method of the invention.
Figure 8:
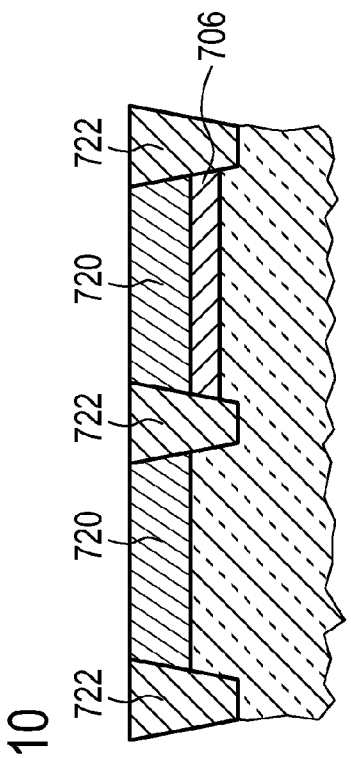

In a subsequent processing step, the result of which is shown in FIG. 8, the surface layer is covered by a resist layer 708, which is patterned to provide openings in the first lateral regions 710. Subsequently, an ion implant indicated by arrows 712 is performed, using amorphizing ions such as silicon Si, germanium (Ge), argon (Ar) or xenon (Xe) ions, or a suitable combination of these. The ion implant 712 is performed at conditions leading to an amorphization of the surface layer 706 in the first lateral regions 710. The resulting amorphized regions 714 extend slightly deeper into the substrate than the interface between the surface layer 706 and the (100)-oriented underlying substrate 704. End-of-Range defects (not shown here) created in the underlying substrate 704 during the ion implant step 712, can be removed during an STI densification anneal. This way, the high-temperature anneal can be included in the thermal budget of the STI densification anneal.

Figure 9:
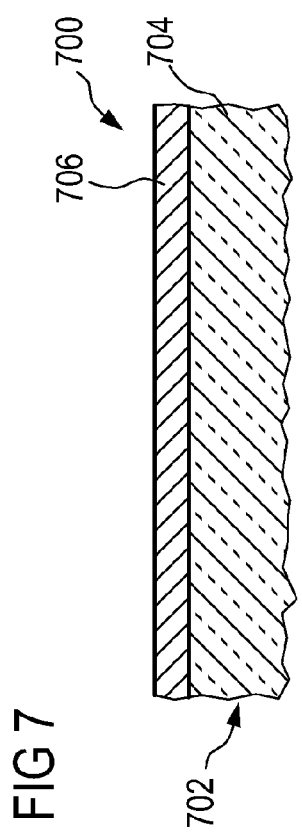

In a subsequent step of solid phase epitaxy, the amorphized regions 714 are recrystallized. Due to the underlying template of the substrate 704 for recrystallization, the amorphized regions take on the (100)-orientation. In this step, defects are also formed in the interface regions 716 between the generated first lateral regions 710 with (100)-orientation and the remaining second lateral regions 718 with (110)-orientation of the surface layer 706. Furthermore, as can be seen in FIG. 9, a cover layer 720 of $Si_3N_4$ is fabricated. It fully covers the substrate after the resist stripping and the recrystallization. The thickness of the cover layer 720 should be selected suitably to accommodate a substantial part of the depth extension of isolation regions 722, which are formed during subsequent processing, cf. FIG. 10. As can be seen, the depth extension of the isolation regions 722 is slightly larger than that of the surface layer 706. That means that the isolation regions 722 extend into the (100)-oriented substrate 704. The thickness of the cover layer 720 furthermore depends on the desired thickness of the (110)-oriented second surface regions 718 in the finalized dual-orientation substrate. The STI regions 722 laterally cover the defect regions 716, thus removing the defect problems at the interface between the (100)-oriented first substrate regions 710 and the (110)-oriented second substrate regions 718.

Figure 11:
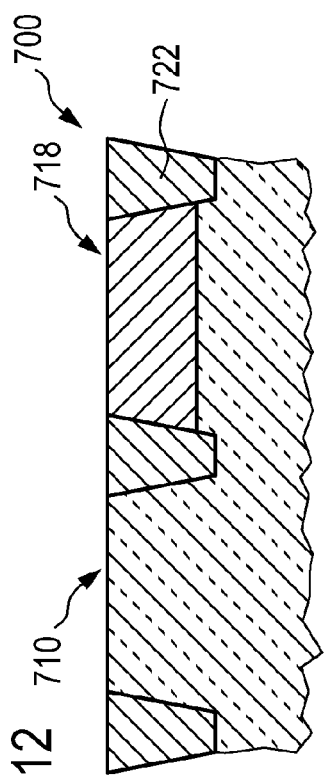
Figure 12:
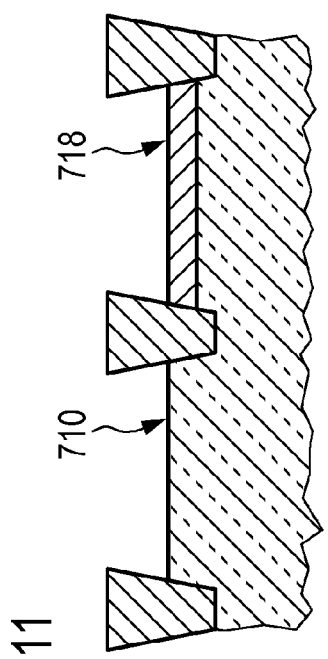

In the present embodiment, the isolation regions 722 are fabricated by known shallow-trench-isolation techniques, leading to a typical trapezoidal shape. The STI isolation regions 722 are fabricated by first etching trenches, using an etching agent that attacks $Si_3N_4$ and silicon, in a masked etching step. Subsequently, the trenches are filled with a suitable isolating material. An example is silicon dioxide. However, other materials can be used as well, provided that they withstand a subsequent etching step in which the cover layer 720 is completely removed. The result of this etching step is shown in FIG. 11. The etching is performed selectively, i.e. the isolation regions 722 and the underlying silicon in the first and second lateral regions 710 and 718 is not attacked.

After the cover layer has been removed, the first and second lateral regions 710 and 718 are filled in a selective facet-free epitaxy step in which silicon is deposited. Known facet-free epitaxial techniques employ chemical vapor deposition (CVD). Due to the different crystalline structures provided as templates in the first and second lateral regions, the epitaxial filling follows the given templates, resulting in a dual-orientation substrate surface after the epitaxy step.

Note that the present embodiment allows a fabrication of the (110)-oriented layer to any desired thickness, which is required by a particular device application.

The minimum lateral isolation STI width, as it is observed in a planar top view of the substrate, corresponds to the distance between the N-active and P-active regions and is given by the respective technology node employed. This spacing between the first and second lateral regions, which in the art is also referred to as the $N_{active}/P_{active}$ spacing, can be scaled to a desired level according to a technology node to be employed by adapting the thickness of the cover layer 720. For instance, the minimum STI width is roughly equal to 100 nm in the 45 nm node (node n), and will be around 50 nm for the 22 nm node (node n+2). The STI scaling rule of thumb is for node (n+1), width (node n+1)=0.7*width (node n). In order to fulfill those requirements imposed by the technological node, two levers are provided by the present invention: either adapting the thickness of the initial bonded (110)-top layer 706, or adapting the thickness of the sacrificical cover layer 720.

The described technique allows preventing junction leakages at the interface between the (110)-oriented surface layer 706 and the underlying substrate 704 also at high levels of scaling.

Figure 10:
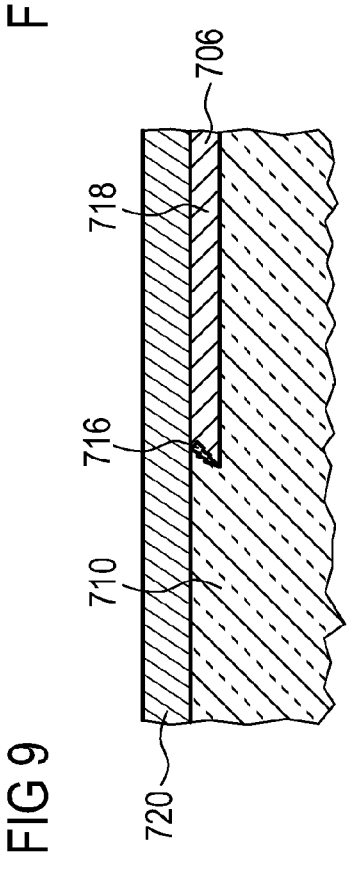

A modification of this embodiment can be performed at the processing stage of FIG. 10. In this modification the selective epitaxy is performed separately in the first and second lateral regions 710 and 718, i.e., the nMOS area and pMOS areas of the dual-orientation substrate.

To this end, a masking step is inserted between the processing stages of FIG. 10 and FIG. 11 in order to realize the following sequence:
a) masking of either pMOS area 718 or nMOS area 710. This step is performed by conventional lithographic techniques;
b) selective removal of the $Si_3N_4$ cover layer in the non-masked, i.e., just opened area;
c) selective facet-free epitaxy growth in the opened area;
d) mask removal.
e) complementary masking step in order to mask the recently regrown area;
f) $Si_3N_4$ selective removal in the still non regrown opened area;
g) selective facet-free epitaxy growth in the area just opened; and
h) mask removal.

Figure 13:
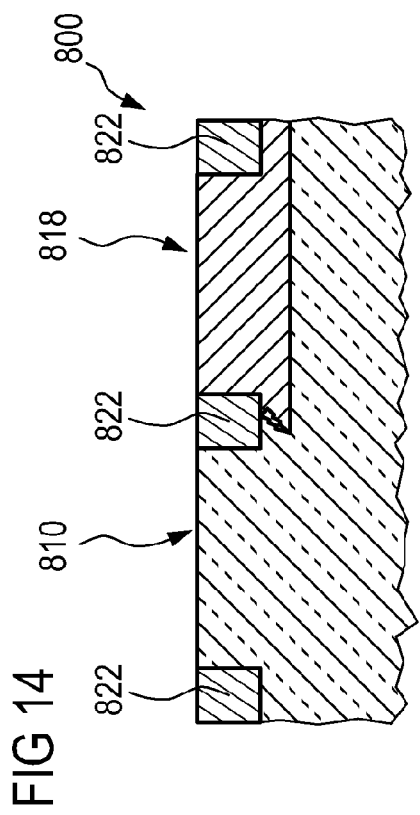
FIGS. 13 and 14 show schematic cross-sectional views of a dual-orientation substrate during two processing stages according to a second embodiment of the invention.
Figure 14:
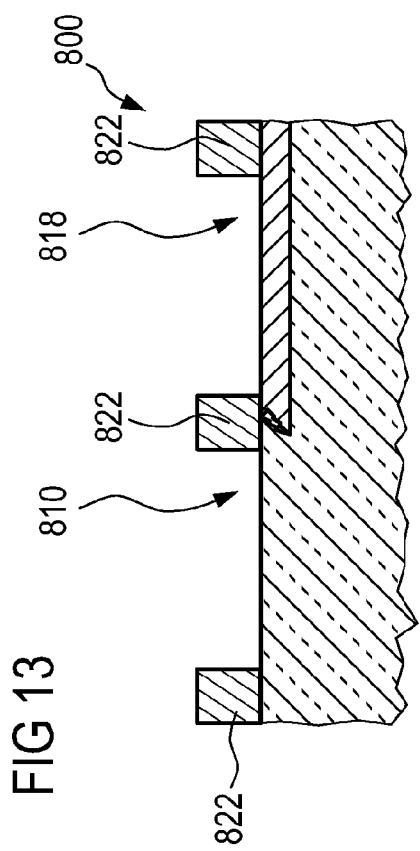

FIGS. 13 and 14 show schematic cross-sectional views of a dual-orientation substrate 800 during two processing stages according to a second embodiment of the invention.

The method of the present embodiment employs an identical processing as the embodiment described with reference to FIGS. 7 to 12 up to the deposition of the cover layer 720. Then, instead of fabricating trenches for STI region 722, the cover layer 720 is patterned to fabricate isolation regions 822 from cover layer material. This can be performed by a masked anisotropical etching step using, for instance, a remote plasma of $CF_4$ and $SF_6$, in order to selectively free the first and second lateral regions 810 and 818 from the cover layer material. Subsequently, as shown in FIG. 14, the first and second lateral regions are rebuilt by a facet-free CVD epitaxy step, leading to a flat dual-orientation surface, as described for the previous embodiment with reference to FIG. 12.

Figure 15:
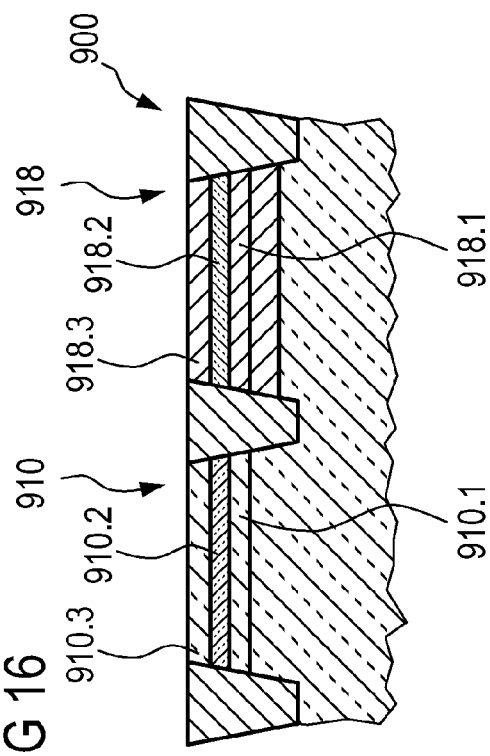
FIGS. 15 and 16 show schematic cross-sectional views of a dual-orientation substrate during two processing stages according to a third embodiment of the invention.
Figure 16:
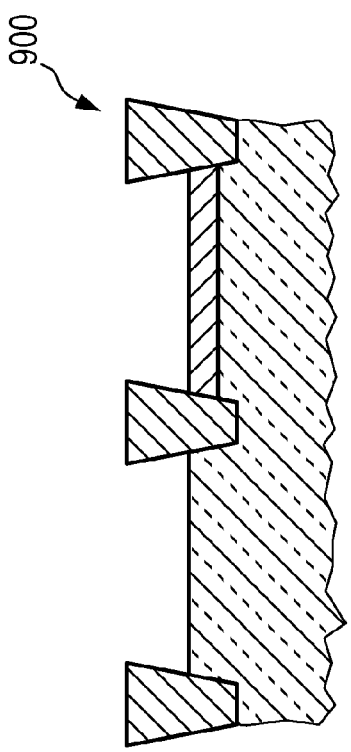

Another modification of the embodiment of FIGS. 7 to 12 is shown with reference to FIGS. 15 and 16. FIGS. 15 and 16 show schematic cross-sectional views of a dual-orientation substrate 900 during two processing stages according to a third embodiment of the invention. In this embodiment, the processing stage of FIG. 11, which is shown in FIG. 15, is followed by a facet-free epitaxial deposition of a layer sequence of different materials. In the present embodiment, a first layer 910.1 of silicon is deposited in the first lateral region 910, and at the same time with (110)-orientation in the second lateral region 918 as layer 918.1. Subsequently, SiGe with a desired composition is deposited as (100)-oriented SiGe-layer 910.2 in the first lateral region 910, and as (110)-oriented SiGe-layer 918.2 in the second lateral region 918. Finally, a silicon layer is deposited to finalize the epitaxial step, providing a (100)-oriented silicon layer 910.3 in the first lateral region 910 and a (110)-oriented silicon layer 918.3 in the second lateral region 918.

As explained in the previous sections of the present specification, the invention can be used for device integration with a dual-orientation substrate in order to provide a maximum mobility for both, electrons and holes. In addition, this invention is fully compatible with the so-called silicon-on-nothing (SON) technology for thin-film device integration as shown in the embodiment of FIGS. 15 and 16.

In a SON process, a layer sequence as that of FIG. 16 can be used to laterally remove the SiGe-layers 910.2 and 918.2 selectively without attacking the surrounding silicon layers 910.1 and 910.3, and 918.1, 918.3, respectively. An air tunnel is thus formed, which isolates the upper silicon layers 910.3, 918.3 from the substrate. Despite the air tunnel, a gate stack fabricated on top will not collapse because it bridges the active area and is supported at both ends. However, the air tunnel can also be filled with an alternative dielectric material.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope. In order to clearly differentiate between reference signs and the common type of notation crystal for orientations using parentheses in the claims, reference signs are provided within braces { }.

The invention claimed is:
1. A method for fabricating a dual-orientation group-IV semiconductor substrate, comprising the steps:
providing a (100)-oriented group-IV semiconductor substrate and a (110)-oriented group-IV semiconductor surface layer on the substrate;

performing a masked amorphization only in first lateral regions of the surface layer, in which first lateral regions a (100)-oriented surface is desired;

performing a solid-phase epitaxial recrystallization of the surface layer in only the first lateral regions so as to establish their (100)-orientation;

fabricating a cover layer on the surface layer;

fabricating isolation regions, which extend from the surface of the cover layer towards the substrate at least to the surface layer and which laterally separate (100)-oriented first lateral regions and (110)-oriented second lateral regions from each other;

removing the cover layer in a selective manner with respect to the isolation regions so as to uncover the first and second lateral regions; and refilling the first and second lateral regions between the isolation regions by performing an epitaxy of group-IV semiconductor material.

2. The method of claim 1, wherein a direct-silicon-bonded substrate is provided for performing the masked amorphization.

3. The method of claim 1, wherein the (110)-oriented group-IV surface layer has a thickness of between about 30 and about 120 nm.

4. The method of claim 1, wherein performing the masked amorphization comprises an ion-implantation step.

5. The method of claim 1, wherein fabricating the cover layer comprises depositing a silicon nitride layer on the surface layer.

6. The method of claim 1, wherein the step of fabricating isolation regions includes fabricating trenches in the cover layer and filling the trenches with an isolating material.

7. The method of claim 6, wherein the step of fabricating isolation regions includes fabricating the trenches with an extension towards the substrate that reaches beyond an interface between the substrate and the surface layer.

8. The method of claim 1, wherein the step of removing the cover layer in a selective manner with respect to the isolation regions and refilling the first and second lateral regions between the isolation regions is performed in the first and second lateral regions at the same time.

9. The method of claim 1, wherein the step of removing the cover layer in a selective manner with respect to the isolation regions and refilling the first and second lateral regions between the isolation regions respectively include separately removing the cover layer and refilling the first lateral regions and the second lateral regions, using complementary respective masks to protect the respective lateral region that is not being processed.

10. The method of claim 1, wherein the step of fabricating the cover layer comprises depositing an isolating material on the surface layer, and wherein the step of fabricating isolation regions and the step of removing the cover layer in the first and second lateral regions are performed in the same fabricating step, and protecting the cover layer from removal in the isolation regions.

11. The method of claim 1, wherein refilling the first and second lateral regions between the isolation regions comprises performing a selective facet-free epitaxy of the group-IV semiconductor material.

12. The method of claim 1, wherein refilling the first and second lateral regions comprises depositing a hetero-stack with a sequence of layers of group-IV-semiconductor material with different material compositions.

13. A method comprising:

providing a surface layer of (110)-oriented group-IV semiconductor material on a substrate of (100)-oriented group-IV semiconductor material;

amorphizing and recrystallizing a first region in the surface layer to set a (100)-orientation of the group-IV semiconductor material in the first region, the first region being laterally adjacent a second region in the surface layer having the (110)-oriented group-IV semiconductor material;

fabricating a cover layer on the surface layer;

fabricating an isolation region that laterally separates the first and second regions from each other and that extends from an upper surface of the cover layer and through the surface layer;

removing portions of the cover layer over the first and second regions; and epitaxially growing additional (100)-oriented group-IV semiconductor material over the first region and additional (110)-oriented group-IV semiconductor material over the second region, the additional (100)-oriented and (110)-oriented group-IV semiconductor materials being laterally separated by the isolation region.

14. The method of claim 13, wherein the steps of fabricating a cover layer, fabricating an isolation region and removing the cover layer are carried out by fabricating the cover layer, and fabricating the isolation region by removing portions of the cover layer over the first and second regions, leaving behind a portion of the cover layer that is over both a portion of each of the first and second regions, the portion of the cover layer left behind being the isolation region.

15. The method of claim 13, wherein epitaxially growing the additional (100)-oriented group-IV semiconductor material over the first region and the additional (110)-oriented group-IV semiconductor material over the second region includes epitaxially growing successive layers of (100)-oriented Si, SiGe, and Si over the first region, and epitaxially growing successive layers of (110)-oriented Si, SiGe, and Si over the second region.

* * * * *